(12) United States Patent
Mooney et al.

(10) Patent No.: US 9,893,683 B2
(45) Date of Patent: Feb. 13, 2018

(54) SYSTEMS FOR AMPLIFYING A SIGNAL USING A TRANSFORMER MATCHED TRANSISTOR

(71) Applicant: Raytheon Company, Waltham, MA (US)

(72) Inventors: Jon Mooney, Dallas, TX (US); David D. Heston, Dallas, TX (US); Bryan G. Fast, Garland, TX (US); Thomas L. Middlebrook, Rowlett, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/062,796

(22) Filed: Mar. 7, 2016

(65) Prior Publication Data

US 2017/0257069 A1    Sep. 7, 2017

(51) Int. Cl.
*H03F 1/56* (2006.01)
*H03F 1/48* (2006.01)
*H03F 3/193* (2006.01)
*H03F 3/24* (2006.01)
*H03F 3/189* (2006.01)
*H04B 1/18* (2006.01)

(52) U.S. Cl.
CPC ............. *H03F 1/483* (2013.01); *H03F 1/565* (2013.01); *H03F 3/189* (2013.01); *H03F 3/193* (2013.01); *H03F 3/24* (2013.01); *H03F 3/245* (2013.01); *H04B 1/18* (2013.01); *H03F 2200/222* (2013.01); *H03F 2200/255* (2013.01); *H03F 2200/318* (2013.01); *H03F 2200/36* (2013.01); *H03F 2200/451* (2013.01); *H03F 2200/534* (2013.01); *H03F 2200/537* (2013.01); *H03F 2200/543* (2013.01)

(58) Field of Classification Search
USPC .................................. 330/302, 185, 188, 190
See application file for complete search history.

(56) References Cited

U.S. PATENT DOCUMENTS 3,559,091 A     1/1971 Lunden et al.
5,179,461 A *   1/1993 Blauvelt ............ H04B 10/6973
                                                  330/165

(Continued)

OTHER PUBLICATIONS

Charles F. Campbell et al. "Wideband Gallium Nitride Distributed Power Amplifier MMICs Utilizing Cascode Connected FET Cells and a Ruthroff Transformer" 3 pages.

(Continued)

*Primary Examiner* — Hieu Nguyen
(74) *Attorney, Agent, or Firm* — Daly, Crowley, Mofford & Durkee, LLP

(57) ABSTRACT

A circuit for amplifying a source signal generated by a signal source having a first impedance includes a transmission line transformer (TLT) having a first, a second, a third, and a fourth port wherein the TLT is coupled to receive the source signal at the first port and configured to output a corresponding impedance matched signal at the second port, the second port is coupled to the third port of the TLT, the circuit also including a TLT load having a first terminal coupled to the fourth port of the TLT and a second terminal coupled to a reference potential. The circuit additionally includes an amplifier device responsive to the impedance matched signal to generate an amplified signal.

20 Claims, 4 Drawing Sheets

(56) References Cited

U.S. PATENT DOCUMENTS

| | | |
|---|---|---|
| 7,898,340 B2 | 3/2011 | Heston et al. |
| 7,982,544 B2 | 7/2011 | Heston et al. |
| 9,548,706 B2 * | 1/2017 | Thomas .................. H03F 3/193 |
| 2009/0085666 A1 | 4/2009 | Ohnishi et al. |
| 2010/0102885 A1 | 4/2010 | Heston et al. |
| 2010/0259319 A1 | 10/2010 | Chan et al. |

OTHER PUBLICATIONS

Inder J. Bahl "Broadband and Compact Impedance Transformers for Microwave Circuits" IEEE Microwave Magazine; Aug. 2006; 5 pages.
Kian Sen Ang et al. "Analysis and design of coupled line impedance transformers" IEEE MTT-S Digest; 2004, 4 pages.
Steve C. Cripps "Microwave Bytes, Cultural Transformation" IEEE Microwave Magazine; Oct. 2009, 6 pages.
Search Report and Written Opinion dated Apr. 12, 2017 for PCT Application No. PCT/US2017/015782; 13 pages.

* cited by examiner

SYSTEMS FOR AMPLIFYING A SIGNAL USING A TRANSFORMER MATCHED TRANSISTOR

FIELD

This disclosure relates generally to systems for amplifying a signal, and more particularly, to a system for amplifying a signal using a transformer matched transistor.

BACKGROUND

As is known in the art, amplifier systems and circuits can be found in a wide variety of applications including electronic warfare, radar, jamming, instrumentation (test and measurement) and communication applications. These systems and circuits typically include an amplifier which is coupled to receive signals from a source which drives or provides signals to the amplifier for amplification. These systems and circuits also typically include an impedance matching device or network which is used to match the output impedance of the source (i.e., the output impedance "seen" by the amplifier being driven by an output of the source) with the input impedance of the amplifier (i.e., the impedance "seen" by the source driving an input of the amplifier) in order to efficiently transfer the signal from the source to the amplifier for amplification.

Known impedance matching networks (e.g., impedance matching networks utilizing shunt capacitors) are generally effective at matching the above-described impedances and providing for maximum gain or power transfer between the source and the amplifier. However, known impedance matching networks typically cause the amplifier to have a reduced or narrower bandwidth than was intended, which is undesirable for reasons apparent (e.g., resulting in the loss of some signal frequencies in the range of signal frequencies which the amplifier was intended to amplify), as described in U.S. Pat. Nos. 7,898,340 and 7,982,544, for example, each of which is assigned to the assignee of the present disclosure and incorporated herein by reference in its entirety.

The foregoing drives a need for impedance matching networks which provide for increased bandwidth capabilities in comparison to known impedance matching networks. The foregoing also drives a need for systems (e.g., amplifier systems) which include these impedance matching networks.

SUMMARY

Described herein are concepts, systems, circuits and techniques related to systems for amplifying a signal. The described systems can, for example, be used to provide circuits (e.g., amplifier circuits) for amplifying a signal (e.g., a source signal) generated by a source (e.g., a signal source). The described systems can also be used to provide impedance matching networks, and circuits including amplifiers with increased (or extended) bandwidth capabilities in comparison to known amplifier circuits.

In one aspect of the concepts described herein, a circuit for amplifying a source signal generated by a signal source having a first impedance includes a transmission line transformer (TLT) having first, second, third, and fourth ports. The TLT is coupled to receive the source signal at the first port and configured to output a corresponding impedance matched signal at the second port. The second port of the TLT is coupled to the third port of the TLT. The circuit also includes a TLT load having a first terminal coupled to the fourth port of the TLT and a second terminal coupled to a reference potential. The circuit additionally includes an amplifier device responsive to the impedance matched signal to generate an amplified signal, the amplifier device having a second impedance. The TLT matches the impedance of the signal source with the impedance of the amplifier device such that the impedance matched signal and the source signal are substantially equal in magnitude.

The circuit may include one or more of the following features individually or in combination with other features. The TLT load includes one or more resistors and one or more capacitors. The TLT load includes one or more inductors. A first terminal of a first one of the resistors in the TLT load may be coupled to the first terminal of the TLT load. A first terminal of a first one of the capacitors in the TLT load may be coupled to a second terminal of the first one of the resistors in the TLT load. A second terminal of the first one of the capacitors in the TLT load may be coupled to the second terminal of the TLT load. The TLT load may include an inductor having first and second opposing terminals. The first terminal of the inductor may be coupled to the first terminal of the TLT load. A first terminal of a second one of the capacitors in the TLT load may be coupled to the second terminal of the inductor. A second terminal of the second one of the capacitors may be coupled to the second terminal of the TLT load. At least one of the first and second ones of the capacitors may be an metal-insulator-metal (MIM) capacitor. The reference potential which the second terminal of the TLT load is coupled to may be ground.

The amplifier device may include a transistor having a source terminal, a drain terminal and a gate terminal. The amplifier device may be coupled to receive the impedance matched signal at the gate terminal of the transistor and configured to generate the amplified signal at the drain terminal of the transistor. The transistor may be provided as a field-effect transistor (FET). The source terminal of the transistor may be coupled to a reference potential. The reference potential which the source terminal of the transistor may be coupled to may be ground. The second impedance of the TLT may be an input impedance of the gate terminal of the transistor. At least the TLT may be provided as part of an impedance match device. The amplifier device may be provided as part of a power amplifier (PA) circuit. The circuit may be integrated into a communications device.

In another aspect of the concepts described herein, a circuit for amplifying a source signal generated by a signal source having a first impedance includes a transmission line transformer (TLT) having first, second, third, and fourth ports. The TLT is coupled to receive the source signal at the first port and configured to output a corresponding impedance matched signal at the first port. The second port of the TLT is coupled to the third port of the TLT. The circuit also includes a TLT load having a first terminal coupled to the second port of the TLT and a second, opposing terminal coupled to a reference potential. The circuit additionally includes a capacitor coupled to the fourth port of the TLT. The circuit further includes an amplifier device responsive to the impedance matched signal to generate an amplified signal. The amplifier device has a second impedance. Additionally, the TLT matches the first impedance of the signal source with the second impedance of the amplifier device such that the impedance matched signal and the source signal are substantially equal in magnitude.

The circuit may include one or more of the following features individually or in combination with other features. The TLT load may include one or more resistors and one or more capacitors. A first terminal of a first one of the resistors may be coupled to the first terminal of the TLT load. A first terminal of a first one of the capacitors may be coupled to a second terminal of the first one of the resistors. A second terminal of the first one of the capacitors may be coupled to the second terminal of the TLT load. The TLT load may include an inductor having first and second opposing terminals. The first terminal of the inductor may be coupled to the first terminal of the TLT load. A first terminal of a second one of the capacitors may be coupled to the second terminal of the inductor. A second terminal of the second one of the capacitors may be coupled to the second terminal of the TLT load.

The amplifier device may include a transistor having a source terminal, a drain terminal and a gate terminal. The amplifier device may be coupled to receive the impedance matched signal at the gate terminal of the transistor and configured to generate the amplified signal at the drain terminal of the transistor. The second impedance of the TLT may be an input impedance of the gate terminal of the transistor.

In another aspect of the concepts described herein, a circuit includes a transmission line transformer (TLT) having a first, a second, a third, and a fourth port, with the second port coupled to the third port. The circuit also includes a TLT load having a first terminal coupled to the fourth port of the TLT and a second terminal coupled to a reference potential. The TLT load includes a resistor and capacitor coupled in series. The circuit additionally includes an amplifier device coupled to the second port of the TLT. The amplifier device has an impedance different than an impedance at the first port of the TLT.

BRIEF DESCRIPTION OF THE DRAWINGS

Features and advantages of the concepts, systems, circuits and techniques disclosed herein will be apparent from the following description of the embodiments taken in conjunction with the accompanying drawings in which.

DETAILED DESCRIPTION

Figure 1:
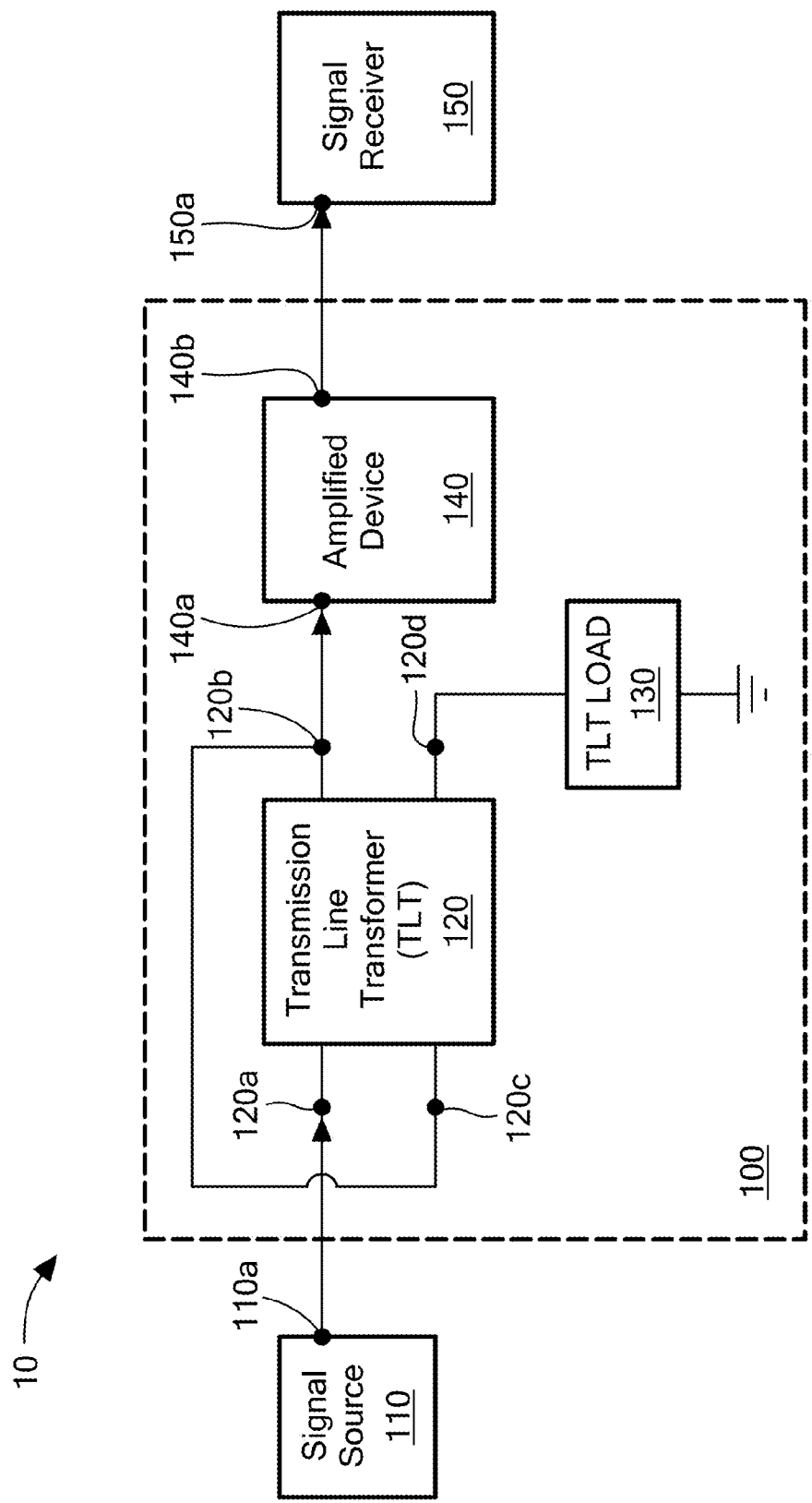
FIG. 1 is a block diagram of an example system for amplifying a source signal which includes a transmission line transformer (TLT) and a TLT load.

Referring now to FIG. 1, a system 100 according to the disclosure (e.g., a power amplifier system) which may be used to amplify a signal (e.g., a source signal, as will be discussed) is shown. A system 10 includes a signal source 110, the power amplifier system 100 and a signal receiver 150. The power amplifier system 100 includes a transmission line transformer (TLT) 120, a TLT load 130 and an amplifier device 140. TLT 120 is serially coupled in a signal path between an output 110a of signal source 110 and an input 140a of amplifier device 140. Additionally, amplifier device 140 is serially coupled in a signal path between an output of TLT 120 (here, port 120b) and an input 150a of signal receiver 150.

Signal source 110, which may be substantially any device that supplies a signal such as a signal generator, a power amplifier, or a cable coupled to a signal generator or power amplifier as a few examples, generates a source signal to be amplified at the output 110a of the signal source 110. The source signal may, for example, be substantially any electrical signal including signals utilized in electronic warfare, radar, jamming, instrumentation (test and measurement) and communication systems as a few examples. In one embodiment, the source signal includes a direct current (DC) bias (e.g., for controlling or driving the amplifier device 140). The signal source 110 has a first impedance (e.g., fifty ohms (50Ω)). The first impedance may, for example, correspond to an output impedance of the signal source 110.

The TLT 120, which may be provided as a Ruthroff type TLT, for example, has a plurality of ports (here, four ports). A first one of the ports 120a of the TLT 120, which is also sometimes referred to herein as a "first port" 120a, is coupled to output 110a of the signal source 110. First port 120a corresponds to an input port of the TLT 120 in the illustrated embodiment. A second one of the ports 120b of the TLT 120, which is also sometimes referred to herein as a "second port" 120b, is coupled to an input 140a of amplifier device 140. The amplifier device 140 has a second impedance (e.g., one ohm (1Ω)). The second impedance may, for example, correspond to an input impedance of the amplifier device 140. Second port 120b is also coupled to a third one of the ports 120c of the TLT 120, which is sometimes referred to herein as a "third port" 120c. Second port 120b corresponds to an output port of the TLT 120 in the illustrated embodiment. Additionally, a fourth one of the ports 120d of the TLT 120, which is also sometimes referred to herein as a "fourth port" 120d (e.g., a "shunt" leg or port), is coupled to a first terminal of the TLT load 130 (e.g., an electrical load).

The TLT load 130, which may include one or more resistors, one or more capacitors, and/or one or more inductors, as will be discussed in further detail in conjunction with FIGS. 3 and 3A, also has a second terminal which is electrically coupled to a reference potential. The reference potential may be ground, which may be a system ground, earth ground, or otherwise.

The TLT 120 is coupled to receive the source signal generated by the signal source 110 at the first port 120a and, in response thereto, TLT 120 provides a corresponding impedance matched signal at the second port 120b. In providing the impedance matched signal, the TLT 120 attempts to match the first impedance of the signal source 110 with the second impedance of the amplifier device 140 such that the impedance matched signal and the source signal are substantially equal in magnitude. Such may, for example, provide for efficient transfer of the signals (i.e., source signals) from signal source 110 to amplifier device 140, and an increased bandwidth of amplifier device 140. In one embodiment, the impedance matched signal is substantially the same as the source signal except for any loss associated with the transfer of the source signal from output 110a of signal source 110 to second port 120b of TLT 120 through TLT 120. The TLT 120 may also match the first impedance of the signal source 110 with the second impedance of the amplifier device 140 to a predetermined characteristic impedance (e.g., a characteristic impedance of about fifty ohms (50 Ωs)). Operation of TLTs (e.g., 120) is known in the art and, therefore, is not described in detail herein.

The amplifier device 140, which may include or be provided as an output transistor of the system of FIG. 1 or of an amplifier circuit, as will be discussed further in conjunction with the figures below, is coupled to receive the impedance matched signal at input 140a. In response to receiving the impedance matched signal, amplifier device 140 amplifies the impedance matched signal and provides an amplified signal at an output 140b of amplifier device 140. The signal receiver 150 (e.g., a base station), which has an input 150a coupled to output 140b, is coupled to receive the amplified signal at the input 150a. The amplified signal may, for example, be received at the input 150a and provided to signal processing circuitry (not shown) in the signal receiver 150 for further processing using techniques well known to those of ordinary skill in the art.

In one embodiment, the TLT 120 and the TLT load 130 are each provided as part of an impedance matching device or network used to match the first impedance of the signal source 110 with the second impedance of the amplifier device 140. In particular, the TLT 120 in combination with the TLT load 130 may be used to match the first impedance of the signal source 110 with the second impedance of the amplifier device 140 to deliver maximum power from the signal source 110 to the amplifier device 140, and improve bandwidth of amplifier device 140 (and the system including the amplifier device 140). The TLT 120 and the TLT load 130 may, for example, extend the bandwidth of the impedance transformation of the impedance matched signal provided by the TLT 120 in comparison to known impedance matching networks (e.g., impedance matching networks utilizing shunt capacitors).

Additionally, in one embodiment, at least one of the TLT 120, TLT load 130, and amplifier device 140 is provided as part of an amplifier circuit 100 (e.g., a power amplifier (PA) circuit). The amplifier circuit 100 is not properly a part of the system in the illustrated embodiment and is thus shown in phantom.

Further, in one embodiment, one or more of the circuit elements of FIG. 1 described above (e.g., TLT 120, TLT 130) and one or more of the circuit elements of FIGS. 2-3B and 4 described below may be provided as part of or implemented in an integrated circuit (IC) as may be found in electronic warfare, radar, jamming, instrumentation (test and measurement) and/or communication devices (e.g., in a handset or base station) as a few examples. Example ICs include Monolithic Microwave Integrated Circuits (MMICs).

Additional aspects of the concepts, systems, circuits and techniques sought to be protected herein, with particular emphasis on the impedance matching provided by TLTs (e.g., 120) in combination with TLT loads (e.g., 130), are described in conjunction with the figures below.

Figure 2:
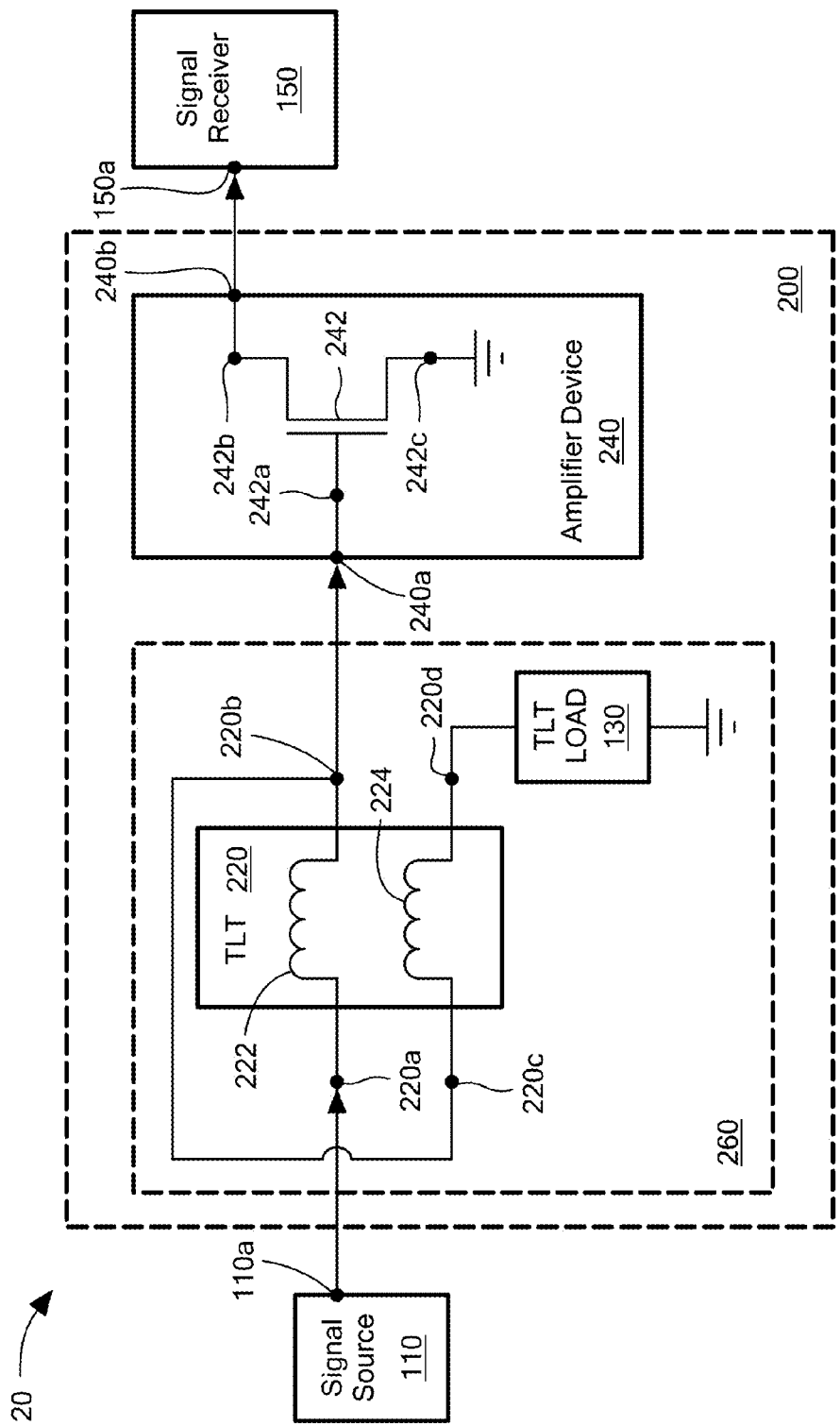
FIG. 2 is a block diagram of another example system for amplifying a source signal which includes a TLT and a TLT load.

Referring now to FIG. 2, in which like elements of FIG. 1 are provided having like reference designations, another example system 200 (e.g., a power amplifier system) for amplifying a signal is shown. A system 20 includes the signal source 110, the power amplifier system 200 and the signal receiver 150. The power amplifier system 200 includes an impedance matching network 260, which includes a TLT 220 and a TLT load 130, and an amplifier device 240. TLT 220 is serially coupled in a signal path between an output 110a of signal source 110 and an input 240a of amplifier device 240. Additionally, amplifier device 240 is serially coupled in a signal path between an output 220b of TLT 220 and an input 150a of signal receiver 150. The signal source 110 has a first impedance (e.g., an output impedance), and the amplifier device 240 has a second impedance (e.g., an input impedance).

The TLT 220, which may be the same as or similar to TLT 120 of FIG. 1, has a first port 220a, a second port 220b, a third port 220c and a fourth port 220d. TLT 220 also includes a pair of conductors (here, conductors 222, 224) in the illustrated embodiment. Conductor 222 is coupled between first port 220a and second port 220b, and conductor 224 is coupled between third port 220c and fourth port 220d. A first terminal of TLT load is coupled to the fourth port 220d (e.g., a "shunt" leg or port). First port 220a corresponds to an input port of the TLT 220 and second port 220b corresponds to an output port of the TLT 220 in the illustrated embodiment.

The TLT 220 is coupled to receive a source signal generated by the signal source 110 at the first port 220a and, in response thereto, TLT 220 provides a corresponding impedance matched signal at the second port 220b. Similar to TLT 120 of FIG. 1, in providing the impedance matched signal, the TLT 220 attempts to match the first impedance of the signal source 110 with the second impedance of the amplifier device 240 such that the impedance matched signal and the source signal are substantially equal in magnitude. In one embodiment, the TLT 220 in combination with the TLT load 130 matches the first impedance of the signal source 110 with the second impedance of the amplifier device 240 to deliver maximum power from the signal source 110 to the amplifier device 240, and to improve bandwidth of amplifier device 240 (and the system of FIG. 2).

The amplifier device 240, which may be the same as or similar to amplifier device 140 of FIG. 1, has an input 240a and an output 240b. Amplifier device 240 also includes a transistor 242 (i.e., a transformer matched transistor 242) which is disposed in a signal path between the input 240a and the output 240b. The transistor 242, which may be provided as an output transistor of the system of FIG. 2 or of an amplifier circuit 200, as will be discussed, has a first terminal 242a coupled to input 240a, a second terminal 242b coupled to output 240b, and a third terminal 242c coupled to a reference potential (e.g., ground). The transistor 242 is coupled to receive the impedance matched signal at the first terminal 242a and configured to generate an amplified signal at the second terminal 242b. Additionally, in embodiments in which the source signal includes a DC bias, as noted above in conjunction with FIG. 1, the DC bias may be passed through the TLT 220 via the source signal and received at first terminal 242a of transistor 242 via the impedance matched signal. Such may, for example, allow for more efficient operation of transistor 242.

The signal receiver 150 is coupled to receive the amplified signal from second terminal 242b (and output terminal 240b) at input 150a of signal receiver 150. As described above in conjunction with FIG. 1, the amplified signal may, for example, be received at the input 150a and provided to signal processing circuitry (not shown) in the signal receiver 150 for further processing.

In one embodiment, the transistor 242 is provided as a field-effect transistor (FET) having a gate terminal, a source terminal and a drain terminal. The gate terminal may correspond to the first terminal 242a of the transistor 242, the source terminal may correspond to the second terminal 242b of the transistor 242, and the drain terminal may correspond to the third terminal 242c of the transistor 242. In this embodiment, the second impedance of the amplifier device 240 may correspond to an input impedance of the gate terminal of the FET. The transistor 242 may also be provided as a bipolar junction transistor (BJT) having a base terminal, an emitter terminal and a collector terminal. The base terminal may correspond to the first terminal 242a of the transistor 242, the emitter terminal may correspond to the second terminal 242b of the transistor 242, and the collector terminal may correspond to the third terminal 242c of the transistor 242. In this embodiment, the second impedance of the amplifier device 240 may correspond to an input impedance of the base terminal of the BJT.

In one embodiment, the TLT 220 and the TLT load 130 are each provided as part of an impedance matching device or network 260. As a result of the impedance matching performed by the impedance matching circuit 260, the impedance matched signal arrives at first terminal 242a of transistor 242 with minimal signal loss. Additionally, the bandwidth of transistor 242 is increased over known amplifiers that utilize a shunt capacitor as an impedance matching device directly on an input of the amplifier (e.g., first terminal 242a of transistor 242). Further, in one embodiment, TLT 220, TLT load 130 and amplifier device 240 are each provided as part of an amplifier circuit (e.g., a power amplifier (PA) circuit) 200. In such embodiment, the transistor 242 may be provided as an output transistor of the amplifier circuit 200.

Additionally, in one embodiment, the system of FIG. 2 further includes an RC network (e.g., a parallel RC network) (not shown) which is disposed in a signal path between second port 220b of TLT 220 and input 240a of amplifier device 240 (e.g., to provide improved input matching of transistor 242 over frequency).

In one aspect of the disclosure herein, by providing the TLT 220 (or alternatively the TLT load 130 of FIG. 1) in a signal path between output port 110a of signal source 110 and the first terminal 242a (e.g., a gate terminal) of transistor 242, bandwidth of amplifier device 240 is improved over known systems which utilize a shunt capacitor for impedance matching.

Figure 3A:
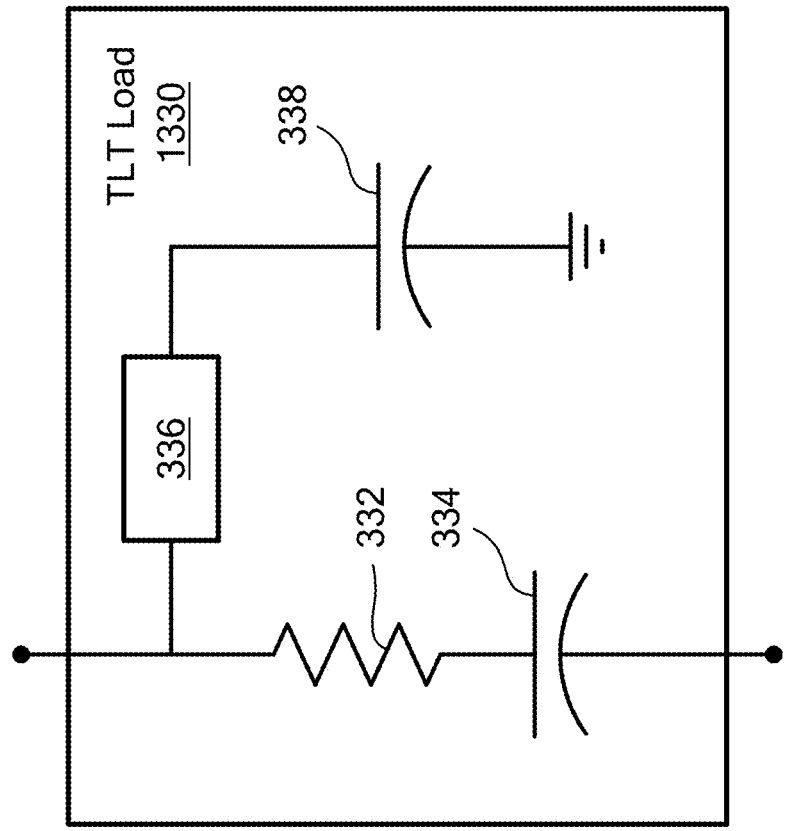
FIG. 3A is a block diagram of another example TLT load which may be used in the systems of FIGS. 1 and 2.
Figure 3:
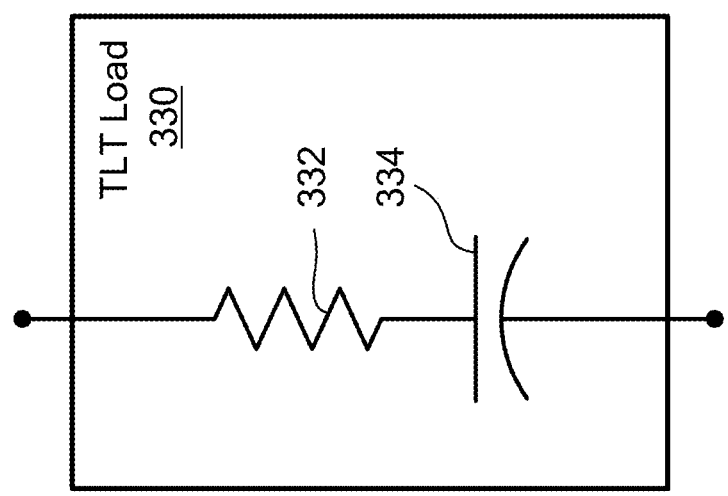
FIG. 3 is a block diagram of an example TLT load which may be used in the systems of FIGS. 1 and 2.

Referring now to FIG. 3, an example TLT load 330 as may be the same as or similar to the TLT load 130 of FIG. 1 or TLT load 130 of FIG. 2, for example, is shown. The TLT load 330 has a first terminal and a second terminal and includes a resistor 332 and a capacitor 334 in the illustrated embodiment. Resistor 332 has a first terminal coupled to the first terminal of the TLT load 330, and a second terminal coupled to a first terminal of the capacitor 334. The capacitor 334, which may be a metal-insulator-metal (MIM) capacitor, for example, has a second terminal coupled to the second terminal of the TLT load 330. The second terminal of the TLT load 330 may, for example, be coupled to a reference potential (e.g., ground), as described above in conjunction with FIG. 1.

The resistor 332 and the capacitor 334 may have resistance and capacitance values, respectively, which are selected at least in part based on impedances of the signal source (e.g., 110) and the amplifier device (e.g., 240) to which the TLT (e.g., 220) and the TLT load 330 are coupled (e.g., to improve bandwidth and stability of the system in which the signal source and the amplifier device are provided). In one embodiment, the resistor 332 has a resistance of about five ohms (5Ω) and the capacitor 334 has a capacitance of about five picofarad (5 pF). Additionally, in one embodiment, at least one of the resistor 332 and the capacitor 334 is provided as a so-called "off-chip" resistor or capacitor, respectively (e.g., to provide for increased performance of the system in which the signal source, the TLT and the amplifier device are provided). Further, in one embodiment, the capacitor 334 may have substantially any capacitance which is sufficient to provide a substantially "low" radio-frequency (RF) impedance, and the capacitance may depend on a frequency of a source signal which is received by the TLT to which the TLT load 330 is coupled.

The above-described TLT load 330 may, for example, extend the bandwidth of the impedance transformation of the impedance matched signal provided by the TLT to which the TLT load 330 is coupled.

It should, of course, be appreciated that the TLT load 330 shown in FIG. 3 is representative of but one example configuration of other configurations of a TLT load. Another example configuration of a TLT load is, for example, described below in conjunction with FIG. 3A.

Referring now to FIG. 3A, in which like elements of FIG. 3 are provided having like reference designations, an example TLT load 1330 has a first terminal and a second terminal and includes the resistor 332 and capacitor 334. The TLT load 1330 also includes an inductor 336 and a capacitor 338 in the illustrated embodiment. Resistor 332 has a first terminal coupled to the first terminal of the TLT load 1330, and a second terminal coupled to a first terminal of the capacitor 334. Additionally, the capacitor 334 has a second terminal coupled to the second terminal of the TLT load 1330. Similar to TLT load 330, the second terminal of the TLT load 1330 may be coupled to a reference potential (e.g., ground).

Inductor 336 has a first terminal coupled to the first terminal of the resistor 332, and a second terminal coupled to a first terminal of the capacitor 338. The capacitor 338, which may be the same as or similar to capacitor 334 in some embodiments, has a second terminal coupled to a reference potential. In one embodiment, the reference potential is the same as the reference potential to which the second terminal of the TLT load 1330 is coupled.

Similar to resistor 332 and capacitor 334 of TLT load 330, the resistor 332, the capacitor 334, the inductor 336, and the resistor 338 of TLT load 1330 may have resistance, capacitance and inductance values, respectively, which are selected at least in part based on impedances of the signal source (e.g., 110) and the amplifier device (e.g., 240) to which the TLT (e.g., 220) and the TLT load 1330 are coupled. In one embodiment, resistor 332 has a resistance of about five ohms (5Ω), capacitor 334 and capacitor 338 each have a capacitance of about five picofarad (5 pF), and inductor 336 has an inductance of about zero-point-two nanoHenry (0.2 nH). Additionally, in one embodiment, capacitor 334 has a different capacitance from capacitor 338. In such embodiment, at least one of capacitor 334 and capacitor 338 may, for example, be used to adjust the frequencies which the TLT load 1330 passes (i.e., adjust the bandwidth of the TLT load 1330).

Although TLT load 1330 is provided as a second order resistor-inductor-capacitor (RLC) circuit or network in the illustrated embodiment, and TLT load 330 is provided as a first order resistor-capacitor (RC) circuit or network in the embodiment of FIG. 3, it should, of course, be appreciated that other TLT loads may also be provided to include third order or greater circuits or networks.

Further, the number, arrangement (e.g., series or parallel), and values (e.g., resistance, capacitance and inductance values) of the elements (e.g., resistors, capacitors, and inductors) of the TLT loads (e.g., 330) may be selected in an embodiment depending upon whether the source signal received by the TLT to which the TLT loads are coupled includes a DC bias or if a DC bias is being supplied from other circuitry in the system in which the TLT and the TLT loads are provided.

Figure 4:
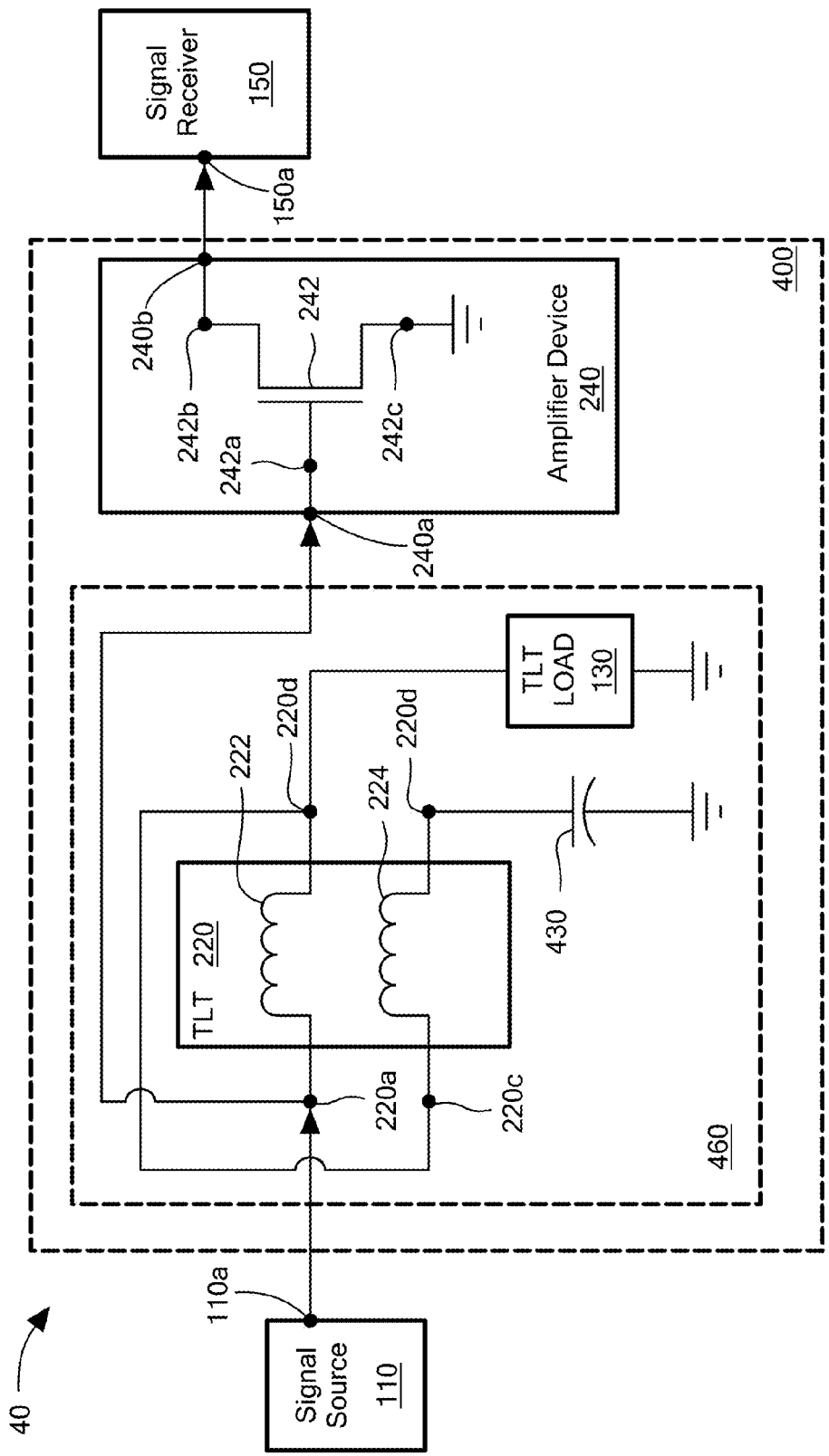
FIG. 4 is a block diagram of another example system for amplifying a signal which includes a TLT and a TLT load.

Referring now to FIG. 4, another example system 400 (e.g., a power amplifier system) for amplifying a signal is shown. A system 40 includes the signal source 110, the power amplifier system 400 and the signal receiver 150. The power amplifier system 400 includes an impedance matching device 460 and the amplifier device 240. The impedance matching device 460 includes the TLT 220, the TLT Load 130 and a capacitor 430. The output of the signal source 110 is coupled to the input of the amplifier device 240 as well as to the first port 220a of TLT 220 (here, a so-called "shunt loaded shunt TLT" of the impedance matching device 460). Additionally, a second port 220b of TLT 220 is coupled to a third port 220c of TLT 220 and to TLT load 130. Further, the capacitor 430, which may be the same as or similar to capacitor 334 of FIG. 3, for example, is coupled to fourth port 220d (e.g., a "shunt" leg or port) of TLT 220.

TLT 220 is coupled to receive a source signal generated by the signal source 110 at first port 220a and, in response thereto, TLT 220 provides an impedance matched signal at the first port 220a. Similar to TLT 220 of FIG. 2, in generating the impedance matched signal, the TLT 220 of FIG. 4 attempts to match the first impedance of the signal source 110 with the second impedance of the amplifier device 240 such that the impedance matched signal and the source signal are substantially equal in magnitude. In one embodiment, the second impedance of the amplifier device 240 is an impedance associated with the first terminal 242a (e.g., a gate terminal) of transistor 242. The impedance matched signal is received at input 240a of amplifier device 240 which, similar to amplifier device 240 of FIG. 2, amplifies the impedance matched signal and provides an amplified signal at an output 240b.

In the illustrated embodiment, TLT 220 is in a so-called "shunt orientation" relative to the transistor 242, and the thru portion of TLT 220 (here, the signal path between first port 220a and second port 220b) is "loaded" with the TLT load 130 (i.e., the TLT load 130 is in a shunt orientation relative to the transistor 242). Both the system of FIG. 2 and the system of FIG. 4 are capable of transforming impedance at the first input 242a (e.g., the gate) of transistor 242, but in accordance with one embodiment, these systems transform the impedance in a different manner.

Having described preferred embodiments, which serve to illustrate various concepts, structures and techniques, which are the subject of this disclosure, it will now become apparent to those of ordinary skill in the art that other embodiments incorporating these concepts, structures and techniques may be used. Additionally, elements of different embodiments described herein may be combined to form other embodiments not specifically set forth above.

For example, while circuits including transmission line transformers (TLTs) which are the same as or similar to each other are described in several examples below, such are discussed to promote simplicity, clarity and understanding in the drawings as well as in the written description of the teachings herein and is not intended to be, and should not be construed, as limiting. The teachings herein may, of course, be implemented using TLTs which are different from each other.

Additionally, while TLT loads (e.g., electrical loads) including a select number of resistors (e.g., one resistor), capacitors (e.g., one capacitor), and/or inductors (e.g., one inductor) are described in several examples below, the select number of resistors, capacitors and/or inductors are discussed to promote simplicity, clarity and understanding in the drawings as well as in the written description of the teachings herein and is not intended to be, and should not be construed, as limiting. The teachings disclosed herein may, of course, be implemented using more than or less than the select number of resistors, capacitors and/or inductors.

Accordingly, it is submitted that that scope of the disclosure should not be limited to the described embodiments but rather should be limited only by the spirit and scope of the following claims.

What is claimed is:

1. A circuit for amplifying a source signal generated by a signal source having a first impedance, said circuit comprising:
   a transmission line transformer (TLT) having a first, a second, a third, and a fourth port, said TLT coupled to receive the source signal at the first port and configured to output a corresponding impedance matched signal at the second port, wherein the second port of said TLT is coupled to the third port of said TLT;
   a TLT load including one or more resistors and one or more capacitors, and having a first terminal coupled to the fourth port of said TLT and a second terminal coupled to a reference potential; and
   an amplifier device responsive to the impedance matched signal to generate an amplified signal, said amplifier device having a second impedance,
   wherein said TLT matches the first impedance of said signal source with the second impedance of said amplifier device such that the impedance matched signal and the source signal are substantially equal in magnitude.

2. The circuit of claim 1 wherein said TLT load further includes one or more inductors.

3. The circuit of claim 1 wherein a first terminal of a first one of the resistors is coupled to the first terminal of said TLT load, a first terminal of a first one of the capacitors is coupled to a second terminal of the first one of the resistors, and a second terminal of the first one of the capacitors is coupled to the second terminal of said TLT load.

4. The circuit of claim 3 further comprising:
   an inductor having a first terminal and a second terminal, wherein the first terminal of the inductor is coupled to the first terminal of said TLT load, a first terminal of a second one of the capacitors is coupled to the second terminal of the inductor, and a second terminal of the second one of the capacitors is coupled to the second terminal of said TLT load.

5. The circuit of claim 4 wherein at least one of the first and second ones of the capacitors is a metal-insulator-metal (MIM) capacitor.

6. The circuit of claim 1 wherein the reference potential is ground.

7. The circuit of claim 1 wherein said amplifier device includes a transistor having a source terminal, a drain terminal and a gate terminal, wherein said amplifier device is coupled to receive the impedance matched signal at the gate terminal of the transistor and configured to generate the amplified signal at the drain terminal of the transistor.

8. The circuit of claim 7 wherein the transistor is provided as a field-effect transistor (FET).

9. The circuit of claim 7 wherein the source terminal of the transistor is coupled to a reference potential.

10. The circuit of claim 9 wherein the reference potential is ground.

11. The circuit of claim 7 wherein the second impedance is an input impedance of the gate terminal of the transistor.

12. The circuit of claim 1 wherein at least said TLT is provided as part of an impedance match device.

13. The circuit of claim 1 wherein said amplifier device is provided as part of a power amplifier (PA) circuit.

14. The circuit of claim 1 wherein the circuit is integrated into a communications device.

15. A circuit for amplifying a source signal generated by a signal source having a first impedance, said circuit comprising:
- a transmission line transformer (TLT) having a first, a second, a third, and a fourth port, said TLT coupled to receive the source signal at the first port and configured to output a corresponding impedance matched signal at the first port, wherein the second port of said TLT is coupled to the third port of said TLT;
- a TLT load including one or more resistors and one or more capacitors, and having a first terminal coupled to the second port of said TLT and a second terminal coupled to a reference potential, wherein a first terminal of a first one of the resistors is coupled to the first terminal of said TLT load, a first terminal of a first one of the capacitors is coupled to a second terminal of the first one of the resistors, and a second terminal of the first one of the capacitors is coupled to the second terminal of said TLT load;
- a capacitor coupled to the fourth port of said TLT; and
- an amplifier device responsive to the impedance matched signal to generate an amplified signal, said amplifier device having a second impedance,
- wherein said TLT matches the first impedance of said signal source with the second impedance of said amplifier device such that the impedance matched signal and the source signal are substantially equal in magnitude.

16. The circuit of claim 15 further comprising:
- an inductor having first and second opposing terminals, wherein the first terminal of the inductor is coupled to the first terminal of said TLT load, a first terminal of a second one of the capacitors is coupled to the second terminal of the inductor, and a second terminal of the second one of the capacitors is coupled to the second terminal of said TLT load.

17. The circuit of claim 15 wherein said amplifier device includes a transistor having a source terminal, a drain terminal and a gate terminal, wherein said amplifier device is coupled to receive the impedance matched signal at the gate terminal of the transistor and configured to generate the amplified signal at the drain terminal of the transistor, wherein the second impedance is an input impedance of the gate terminal of the transistor.

18. A circuit comprising:
- a transmission line transformer (TLT) having a first, a second, a third, and a fourth port, with the second port coupled to the third port;
- a TLT load having a first terminal coupled to the fourth port of said TLT and a second terminal coupled to a reference potential, said TLT load comprising a resistor and capacitor coupled in series; and
- an amplifier device directly coupled to the second port of said TLT, said amplifier device having an impedance different than an impedance at the first port of said TLT.

19. The circuit of the claim 18 wherein said TLT load further includes an inductor having a first terminal coupled to the resistor and a second terminal coupled to a reference potential.

20. The circuit of claim 18 wherein said amplifier device includes a transistor having a source terminal, a drain terminal and a gate terminal, wherein the gate terminal of the transistor is coupled to the second port of said TLT.

* * * * *